United States Patent
Kuroda

[11] Patent Number: 5,346,843
[45] Date of Patent: Sep. 13, 1994

[54] METHOD OF MANUFACTURING A SEMICONDUCTOR DEVICE HAVING A MEMORY CELL AND PERIPHERAL CIRCUIT INCLUDING FORMING A FIRST ELECTRODE FOR THE CAPACITOR

[75] Inventor: Hideaki Kuroda, Kanagawa, Japan

[73] Assignee: Sony Corporation, Tokyo, Japan

[21] Appl. No.: 871,705

[22] Filed: Apr. 21, 1992

[30] Foreign Application Priority Data

Apr. 30, 1991 [JP] Japan .................................. 3-126889

[51] Int. Cl.$^5$ ...................... H01L 21/70; H01L 27/00
[52] U.S. Cl. ...................................... 437/52; 437/60; 437/919
[58] Field of Search ...................... 437/47, 52, 60, 919

[56] References Cited

U.S. PATENT DOCUMENTS 4,603,059  7/1986  Kiyosumi et al. ............. 427/81
5,043,780  8/1991  Fazan et al. .
5,218,219  6/1993  Ajika et al. ..................... 257/309

FOREIGN PATENT DOCUMENTS 0317199  5/1989  European Pat. Off. .

Primary Examiner—Olik Chaudhuri
Assistant Examiner—H. Jey Tsai
Attorney, Agent, or Firm—Hill, Steadman & Simpson

[57] ABSTRACT

According to this invention, a conductive film for forming a plate electrode of a capacitor constituting a memory cell is patterned in only a memory cell region at first. After the conductive film in a peripheral circuit region is used as a stopper for wet-etching a low-melting insulating film of the peripheral circuit region, the conductive film is patterned using the same mask as the low-melting insulating film or the low-melting insulating film itself as a mask. For this reason, an SiN film formed by a low pressure CVD method is not used as a stopper, and an additional lithographic step is not required. Therefore, while a memory cell region is planarized and the step of the peripheral circuit region is reduced, data retaining characteristics can be improved without increasing the number of steps.

5 Claims, 1 Drawing Sheet

METHOD OF MANUFACTURING A SEMICONDUCTOR DEVICE HAVING A MEMORY CELL AND PERIPHERAL CIRCUIT INCLUDING FORMING A FIRST ELECTRODE FOR THE CAPACITOR

BACKGROUND OF THE INVENTION

1. Field of the Invention

The present invention relates to a method of manufacturing a semiconductor memory called a DRAM (Dynamic Random Access Memory).

2. Description of the Prior Art

In a DRAM, since a memory cell is constituted by a capacitor in addition to a transistor, the underlayer of a bit line has a large step. For this reason, in order to reduce the step, planarization is performed by flowing a low-melting insulating film such as a BPSG film.

However, in the DRAM, the step of a peripheral circuit region is originally smaller than that of a memory cell region. For this reason, when the BPSG film is left in the peripheral circuit region to planarize the underlayer of the bit line, the step of an Al wire contact hole or the like is adversely increased, and the step coverage of the Al wire is degraded.

Therefore, the following steps are performed. That is, an SiN film is formed on the underlayer of the BPSG film by a low pressure CVD method, and the BPSG film in only the peripheral circuit region is removed by wet etching using this SiN film as a stopper.

However, since an SiN film formed by the low pressure CVD method has a high density, the SiN film has a function of preventing permeation of hydrogen. In addition, the SiN film covers not only the peripheral circuit region but the entire surface of the memory cell region.

On the other hand, an H2 sinter is generally performed to compensate for a generation recombination center such as an interface state in an Si-SiO2 interface region. This H2 sinter is normally performed before an Al film is deposited and after Al wiring contact hole is formed.

However, since the memory cell region has no Al wiring contact hole, the H2 sinter is not sufficiently performed, and a leakage current caused by the generation recombination center is generated. Therefore, in a DRAM manufactured in a conventional method, a leakage current flows in an access transistor, and sufficient data retaining characteristics cannot always be obtained.

SUMMARY OF THE INVENTION

In a method of manufacturing a semiconductor memory according to the present invention, a low-melting insulating film for planarization is removed in only a peripheral circuit region, such that a memory cell region is planarized and that the step of the peripheral region is reduced.

When the low-melting insulating film in the peripheral region is removed, since a conductive film is left on the underlayer of the insulating film, the conductive film can be used as a stopper when the low-melting-point insulating film is removed. For this reason, a silicon nitride film or the like formed by the low pressure CVD method need not be used as the stopper, a hydrogenation for compensating for a generation recombination center can be sufficiently performed.

In addition, since the conductive film in the peripheral circuit region is removed such that a second resist film used as a mask for removing the low-melting insulating film or the low-melting insulating film left in the memory cell region is used as a mask, an additional lithographic step need not be executed to remove the conductive film from the peripheral circuit region.

That is, in a method of manufacturing a semiconductor memory according to the present invention, even an additional lithographic step is not executed when the step of the peripheral circuit region is reduced, a hydrogenation for compensating for a generation recombination center can be sufficiently performed. Therefore, while the memory cell region can be planarized, and the step of the peripheral circuit region can be reduced, data retaining characteristics can be improved without increasing the number of steps.

DETAILED DESCRIPTION OF THE PREFERRED EMBODIMENT

An embodiment in which the present invention is applied to the manufacture of a stacked capacitor DRAM will be described below with reference to FIGS. 1A to 1D.

Figure 1A:
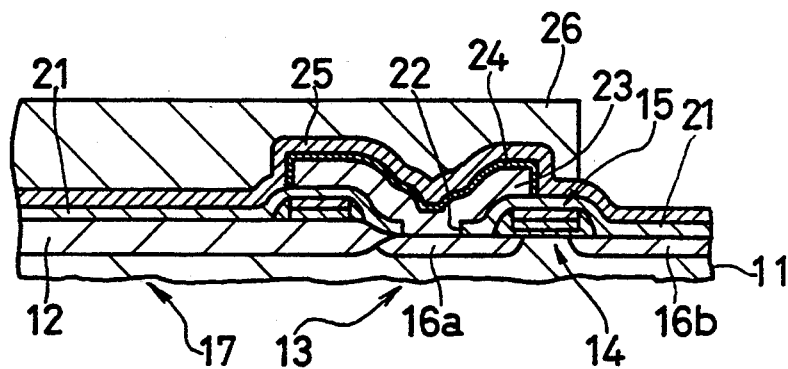
FIGS. 1A to 1D are sectional views showing the steps in manufacturing a semiconductor memory according to an embodiment of the present invention.

In this embodiment, as shown in FIG. 1A, an SiO2 film 12 is formed in an element isolation region of an Si substrate 11 by a LOCOS method. The gate electrode, i.e., a word line, of an access transistor 14 is formed in a memory cell region 13 using a polycide film 15, and diffused layers 16a and 16b are formed therein. At the same time, a transistor (not shown) is formed in a peripheral circuit region 17.

Thereafter, the polycide film 15 and the like are covered with an interlayer insulator 21, and a contact hole 22 reaching the diffused layer 16a is formed in the interlayer insulator 21. A polysilicon film 23 is deposited, and the polysilicon film 23 is doped with an impurity and patterned, thereby forming a storage node which is in contact with the diffused layer 16a.

Thereafter, a dielectric film 24 is formed on the polysilicon film 23 to be used as a capacitor insulating film. A polysilicon film 25 for forming a plate electrode is deposited by a CVD method, and the polysilicon film 25 is doped with an impurity.

Thereafter, a resist 26 is coated on the entire surface of the resultant structure and is patterned. In a conventional patterning operation of the resist 26, the resist 26 of the memory cell region 13 is patterned to have the pattern of a plate electrode, and the resist 26 in the peripheral circuit region 17 is removed. However, in this embodiment, the resist 26 is left on the entire surface of the peripheral circuit region 17.

Figure 1B:
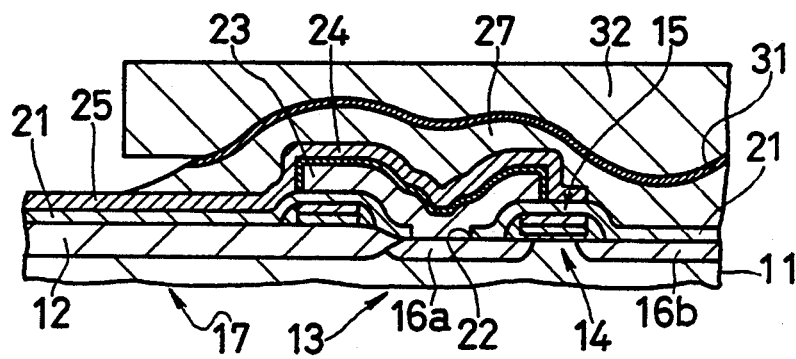

As shown in FIG. 1B, the polysilicon 25 is etched using the resist 26 as a mask. Therefore, although a plate electrode is formed by the polysilicon film 25 in the memory cell region 13, the polysilicon film 25 is left on the entire surface of the peripheral circuit region 17. The resist 26 is removed by ashing after the etching operation.

Thereafter, a BPSG film 27 for planarizing the memory cell region 13 is deposited by a CVD method and is flowed. In addition, an SiO2 film is deposited by a CVD method. A PSG film may be used in place of the SiO$_2$ film 31.

Thereafter, a resist 32 is coated on the resultant structure, and the resist 32 is patterned to cover only the memory cell region 13. The SiO$_2$ film 31 and the BPSG film 27 are wet-etched in the peripheral circuit region 17 using the resist 32 as a mask and the polysilicon film 25 as a stopper.

Figure 1C:
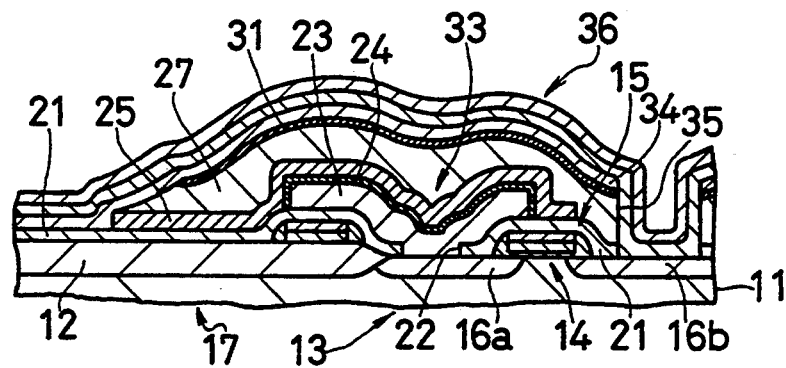

As shown in FIG. 1C, the polysilicon film 25 in the peripheral circuit region 17 is etched using the resist 32 as a mask. Note that, after the resist 32 is removed by ashing, the polysilicon film 25 may be etched using the SiO$_2$ film 31 and the BPSG film 27 as a mask. In the above steps, a capacitor 33 is completed.

Thereafter, an interlayer insulator 34 is deposited by a CVD method, and a contact hole 35 reaching the diffused layer 16b is formed in the interlayer insulator 34 and the like. A bit line which is in contact with the diffused layer 16b is formed by depositing and patterning the polycide film 36.

Figure 1D:
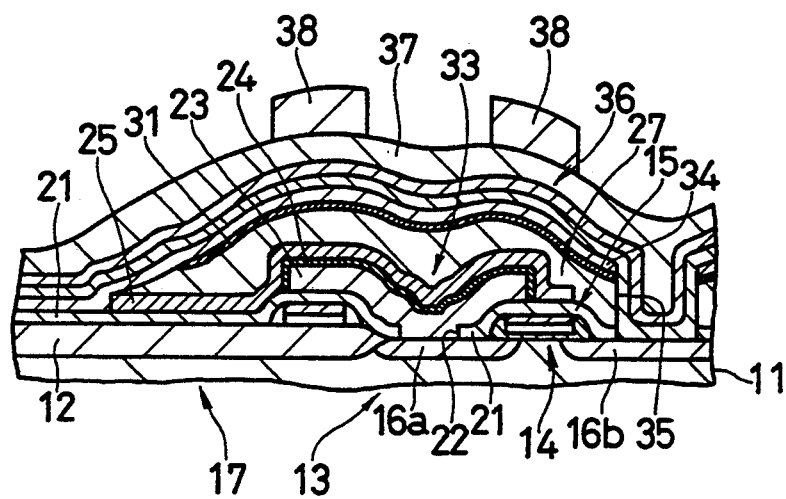

As shown in FIG. 1D, a BPSG film 37 is deposited by a CVD method and is flowed. After an Al wiring contact hole (not shown) is formed, an Al film 38 is formed by sputtering and patterned, thereby completing a stacked capacitor DRAM.

As described above, according to the embodiment, a polysilicon film 25 is used as a stopper for wet-etching the BPSG film 27 in the peripheral circuit region 17, and an SiN film formed by a low pressure CVD method is not used. Therefore, an H$_2$ sinter for compensating for a generation recombination center can be sufficiently performed.

What is claimed is:

1. A method of manufacturing a semiconductor memory having a memory cell region and a peripheral circuit region, and a memory cell being constituted by a transistor and a capacitor, comprising the steps of:
    forming a conductive film which comprises a first electrode for a plate electrode of said capacitor;
    forming a first resist on an entire surface of said peripheral circuit and memory cell regions;
    patterning said conductive film using said first resist as a mask to form said first electrode;
    forming a first insulating film on said conductive film so as to planarize said conductive film;
    forming a second resist on the entire surface of said memory cell region;
    removing said first insulating film from said peripheral circuit region by wet etching using said second resist as a mask;
    removing said conductive film from said peripheral circuit region using said second resist as a mask; and
    removing said second resist.

2. A method of manufacturing a semiconductor memory having a memory cell region and a peripheral circuit region, and a memory cell being constituted by a transistor and a capacitor, comprising the steps of:
    forming a conductive film which comprises a first electrode for a plate electrode of said capacitor;
    forming a first resist on the surface of said peripheral circuit and memory cell regions;
    patterning said conductive film using said first resist as a mask to form said first electrode;
    forming a first insulating film on said conductive film so as to planarize said conductive film;
    forming a second resist on the surface of at least said memory cell region;
    removing said first insulating film from said peripheral circuit region by wet etching using said second resist as a mask;
    removing said second resist; and
    removing said conductive film from said peripheral circuit region using said first insulating film as a mask.

3. A method according to claim 1 or claim 2 wherein during the step of removing said first insulating film said conductive film is used as a stopper.

4. A method according to claim 1 including depositing a BPSG film on said first electrode.

5. A method according to claim 2 including depositing a BPSG film on said first electrode.

* * * * *